United States Patent [19]

Poitevin

[11] Patent Number: 4,550,223
[45] Date of Patent: Oct. 29, 1985

[54] TEST DEVICE, AND METHOD FOR LOCATING FAULTS IN A TWO-LEAD LINE

[76] Inventor: Jean-Pierre R. Poitevin, 53, rue Denis Gogue, Clamart, France, 92140

[21] Appl. No.: 355,330

[22] Filed: Mar. 8, 1982

[30] Foreign Application Priority Data

Apr. 17, 1981 [FR] France .............................. 81 07784

[51] Int. Cl.[4] .............................................. H04B 3/46
[52] U.S. Cl. ............................ 179/175.3 F; 361/106
[58] Field of Search ............... 179/175.3 F, 175.3 A, 179/175.3 R, 175.2 C; 371/22; 324/52; 361/106

[56] References Cited

U.S. PATENT DOCUMENTS

| 2,050,703 | 8/1936 | Johnson | 361/106 |
|---|---|---|---|
| 3,235,677 | 2/1966 | Friedrich | 179/175.3 R |
| 3,636,280 | 1/1972 | Wetzel | 179/175.3 |
| 4,025,736 | 5/1977 | Chlupsa | 179/175.3 F |
| 4,373,121 | 2/1983 | Sartori et al. | 179/175.3 F |
| 4,438,299 | 3/1984 | Tomim | 179/175.3 F |

Primary Examiner—Stafford D. Schreyer
Attorney, Agent, or Firm—Lowe, King, Price & Becker

[57] ABSTRACT

A test device for remotely locating faults in a two-lead line, such as a telephone subscriber loop, comprises a first dipole having terminals connected between the two line leads. The dipole comprises a capacitor series connected with a resistor for locating cut-offs in the line. A second dipole is series connected to one of the line leads, or two dipoles are series connected to the two lines for locating short-circuits in the line. The second dipole has a predetermined relatively high resistance in a low-current region and a lower resistance in a higher current region and may include a negative temperature-coefficient thermistor, or two oppositely poled diodes, or one diode, or a relay having a coil connected in series with a resistor shunted by a make contact of the relay.

35 Claims, 7 Drawing Figures

TEST DEVICE, AND METHOD FOR LOCATING FAULTS IN A TWO-LEAD LINE

BACKGROUND OF THE INVENTION

1. Field of the Invention

The present invention relates to a test device for locating first and second fault types in a two-lead line, wherein the first fault type includes cut-offs, breaks or open circuits and the second fault type includes short circuits, insulation faults or low resistance shunts between one of the line leads and the ground or between the two line leads.

2. Description of the Prior Art

U.S. Pat. No. 3,235,677 describes a fault locating test device which comprises a first dipole connected in shunt with two leads of a communication line. The first dipole comprises a resistor and a rectifier or diode which are series-connected. One of the line ends is connected to a load while the other end is selectively connected to a resistance measuring apparatus.

Line breaks are located with respect to the first dipole by detecting a leakage current which intentionally flows through the diode of the first dipole. The presence of such a shunt diode requires measurement voltages applied to one end of the line to be of a predetermined polarity that is opposite to the polarity of the voltages applied to the line end under normal operating conditions. This drawback requires strict surveillance to ensure that the polarity of the applied voltages is maintained, particularly when working on the line.

Over and above the foregoing, the characteristics of this device are such that it is incompatible with the majority of existing telephone subscriber line test and measuring apparatus. Modifications or additions to these apparatus found in any telephone exchange thus become an extremely expensive necessity in view of the number of apparatus in question.

Furthermore, the distribution between intentionally induced leakage currents and natural leakage currents in certain imperfectly insulated lines is rather fine and makes locating an open circuit in a line fitted with such test device illusory.

OBJECTS OF THE INVENTION

The main object of this invention is, therefore, to provide a test device for locating faults, especially cut-offs, in a two-lead line, which device does not require voltage predetermined polarity to be applied to the line.

Another object of this invention is to provide a test device for locating faults in a two-lead line, which device is compatible with telephone subscriber line testing and measuring apparatus.

SUMMARY OF THE INVENTION

In accordance with the above objects, there is provided a test device for locating faults in a two-lead line in which a first dipole, comprising a resistor connected in series with a capacitor, shunts the two leads of the line.

Unlike known test devices, cut-off, i.e. open circuit, location is determined by capacitances, not resistances. The use of a capacitor in the first dipole avoids any need for line bias when the line is connected; for example a telephone subscriber line connected to a respective trunk of a local telephone exchange. No ambiguity arises in interpreting the measurement, should the line insulation not be perfect. Moreover, the first dipole inserted as per the invention is compatible with existing test and measuring apparatus in those telephone exchanges that are capable of measuring capacitances.

According to another feature of the invention, the test device comprises a second dipole that is series connected to one of the line leads. The second dipole enables distinctions to be made between short circuits or insulation faults that are located in two line sections defined by the second dipole connection. In this case, a fault is located by measuring resistance at the end of the first line section opposite to the end where the line load is connected. The second dipole behaves as a variable resistor having a relatively high predetermined resistance in a low-current region and a lower resistance in a higher-current region adjacent the low-current region. Under normal line operating conditions, the current flowing in the line is included in the high-current region such that the disturbance brought about by the second dipole is practically negligible. A voltage applied by a test and measured apparatus causes a current in the low-current range to flow to permit confirmation of the location of the short-circuit or analogous fault in the line section connected to the load when the measured resistance varies with respect to that measured for a current in the high-current region.

The second dipole may comprise a negative temperature-coefficient thermistor, two oppositely poled diodes, or two parallel channels, one of which comprises a relay operate coil connected in series with a resistor shunted by a make contact of the relay; and the other channel comprises a capacitor.

The test device may further comprise a third dipole that is analogous to the second dipole and series connected with the other line lead.

BRIEF DESCRIPTION OF THE DRAWING

The foregoing and other objects, features and advantages of the invention will be apparent from the following more particular description of preferred embodiments of the invention as illustrated in the accompanying drawings in which.

DESCRIPTION OF THE PREFERRED EMBODIMENTS

Figure 1:
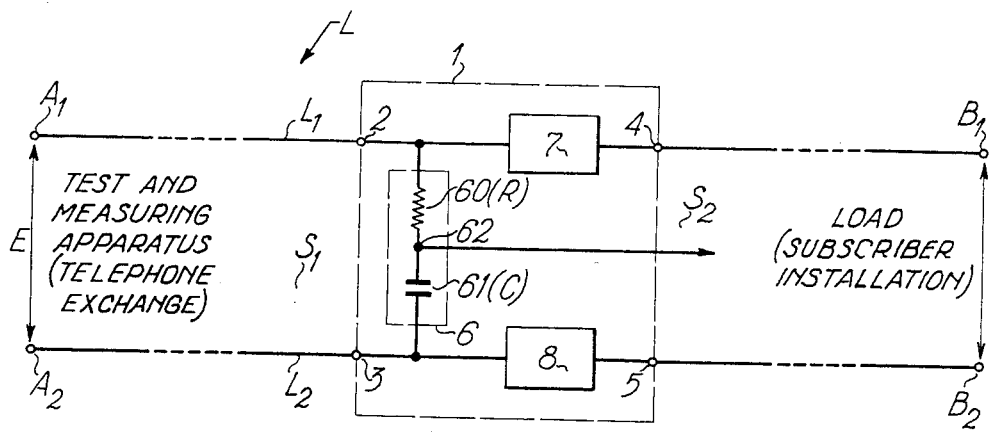
FIG. 1 is a simplified block diagram depicting the introduction of a test device embodying the invention in a two-lead line.

FIG. 1 is an overall block diagram of a preferred embodiment of the entire fault locating test device. The entire test device is a quadrupole 1 connected to a line L having two conductive leads $L_1$ and $L_2$; the quadrupole divides line L into a first line section $S_1$ and a second line section $S_2$. One end of the first line section $S_1$ is selectively connected to terminals $A_1$ and $A_2$ of a testing and measuring apparatus and the other end is connected to first parallel terminals 2 and 3 of quadrupole 1. One end of the second line section $S_2$ is connected to two parallel terminals 4 and 5 of quadrupole 1 and the other end is connected to terminals $B_1$ and $B_2$ of a working load.

In a preferred application, when the two-lead line L is a telephone subscriber line, or loop either coaxial or having two separated wires, terminals $A_1$ and $A_2$ are selectively trunk terminals connected to a testing and measuring apparatus that is included in a switching facility such as the telephone exchange serving the line. Terminals $B_1$ and $B_2$ are the input terminals of a telephone subscriber installation. Reference is made hereinafter to an application of this nature.

According to the embodiment depicted in FIG. 1, quadrupole device 1 comprises a first shunt dipole 6 which is interconnected between terminals 2 and 3 at the telephone exchange end, a second series dipole 7 which is series connected between terminals 2 and 4 on first line lead $L_1$, and a third dipole 8 which is series connected between terminals 3 and 5 on second line lead $L_2$.

FIRST DIPOLE

First dipole 6 is in parallel-connection in line L and serves to locate the cut-offs, also referred to as break or open circuits, along one of the leads or both leads of the line. The first dipole comprises a resistor 60 and a capacitor 61 which are series-connected between terminals 2 and 3.

The resistance R of resistor 60 and the capacitance C of capacitor 61 are selected chiefly in terms of two criteria. The interference brought about by the presence of first dipole 6 must be as small as possible during normal line operation such that the currents flowing in the line and corresponding particularly to a ringing signal for activating the bell of the telephone subscriber installation or to audio signals during the communication sustain negligible attenuation. The second criterion is that the apparent capacitance measured between terminals $A_1$ and $A_2$ from the exchange measuring apparatus must blatantly exceed the natural, i.e. distributed capacitance of the subscriber line L such that the capacitance measurements enable cut-offs along the first and second sections $S_1$ and $S_2$ to be distinguished from each other. The optimum values of R and C thus depend on limit characteristics of the line in question and on the capacitance measuring apparatus employed.

By way of an example, for telephone cables having a capacitance of 50 nF/km and a telephone network wherein none of the telephone subscriber lines is longer than 20 km, the natural capacitance of any subscriber line is less than 1 $\mu$F. The values of resistor 60 and capacitor 61 are selected so the apparent increase in capacitance due to dipole 6 is at least 1 $\mu$F. Should the capacitance measuring apparatus connected between terminals $A_1$ and $A_2$ be based on measuring a line discharge time constant across a 20 kohm resistor, then it is sufficient for R=20 kohms and C=2 $\mu$F for the measured capacitance from the trunk terminals $A_1$, $A_2$ of any subscriber line to be increased by at least 1 $\mu$F as a result of the first dipole 6 being inserted in parallel-connection in the line. Under these conditions, the position of a line cut-off is determined by a capacitance measurement carried out at the exchange terminals $A_1$, $A_2$. If the measurement capacitance exceeds 1 $\mu$F, this means that the cut-off is situated beyond first dipole 6; the cut-off is located in the line part which is made up of the second line section $S_2$ and the load, in this case, the telephone subscriber installation. The length of the second line section $S_2$ can be very short, indeed negligible, when terminals 4 and 5 are practically joined to the input terminals $B_1$ and $B_2$ of the telephone subscriber installation. However, if the measured capacitance is less than 1 $\mu$F, the cut-off is situated before the test device 1 and is therefore located in the first line section $S_1$ between the exchange terminals $A_1$, $A_2$ and terminals 2, 3 of the first dipole 6.

The value of the capacitance effectively measured moreover allows a rough determination of the cut-off location in the line.

SECOND AND THIRD DIPOLES

Second and third analogous dipoles 7 and 8 are series connected in the respective line leads $L_1$ and $L_2$. The dipoles 7 and 8 are intended for locating short-circuits, also referred to as insulation faults or low resistance shunts, between the two line leads or between one of the line leads and the ground.

The invention provides for three types of dipoles 7, 8; each dipole type has a resistance which varies in terms of the line current. The resistance is very small for currents flowing during normal operation of line L and increases in response to a short circuit being on the line.

Figure 2A:
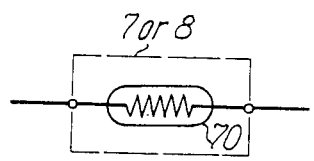
FIGS. 2A and 2B are respectively a circuit diagram of a second or third dipole as per a first embodiment and a voltage-current characteristic thereof.

The first dipole type is depicted in FIG. 2A as of a thermistor 70 having a negative temperature-coefficient (NTC).

Figure 3A:
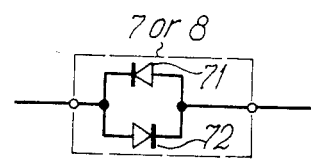
FIGS. 3A and 3B are respectively a circuit diagram of a second or third dipole as per a second embodiment and a voltage-current characteristic thereof.

The second dipole type is shown in FIG. 3A as a pair of oppositely poled parallel diodes 71 and 72.

Figure 4A:
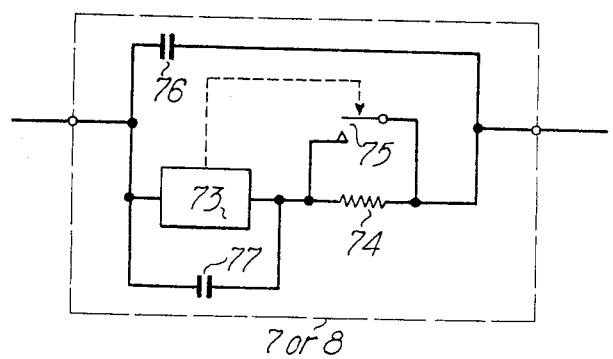
FIGS. 4A and 4B are respectively a circuit diagram of a second or third dipole as per a third embodiment and a voltage-current characteristic thereof.

The third dipole type is shown in FIG. 4A as first and second parallel channels. The first channel comprises a relay 73 having an operate coil connected in series with a resistor 74 shunted by a make contact 75 which is closed when the relay is activated. This first channel is shunted by a capacitor 76 of in the second channel. Capacitor 76 makes the dipole transparent to alternating or impulsing currents. A second capacitor 77, connected in parallel with the coil of the relay 73, can be substituted for or added to capacitor 76 and fulfils substantially the same rôle. Relay 73 may be of the flexible-blade, i.e. reed type. A flexible-blade relay, includes a glass bulb containing either a vacuum or inert gas in which ferromagnetic-blade contact 75 is located and about which a wire forming the operate coil of relay 73 is wound. Among the advantages afforded by using a flexible-blade switch are high switching speed, and low energy consumption as well as straight-forward and inexpensive construction.

Figure 2B:
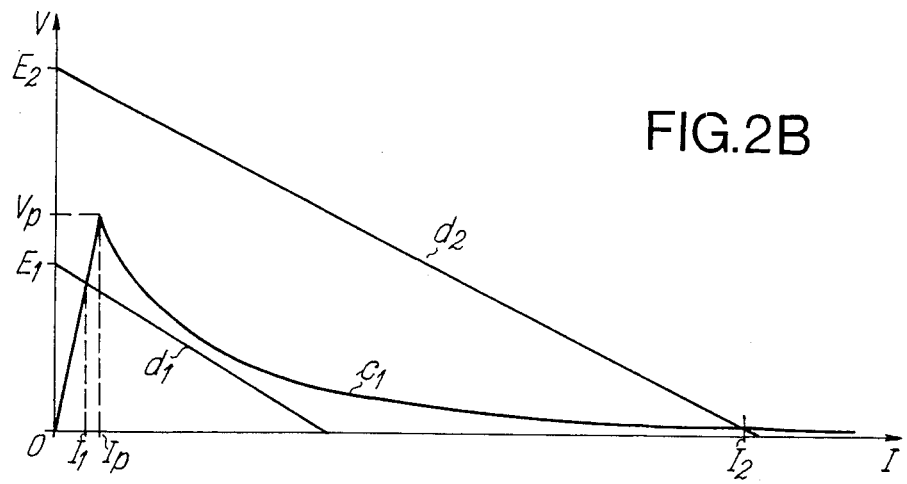
Figure 3B:
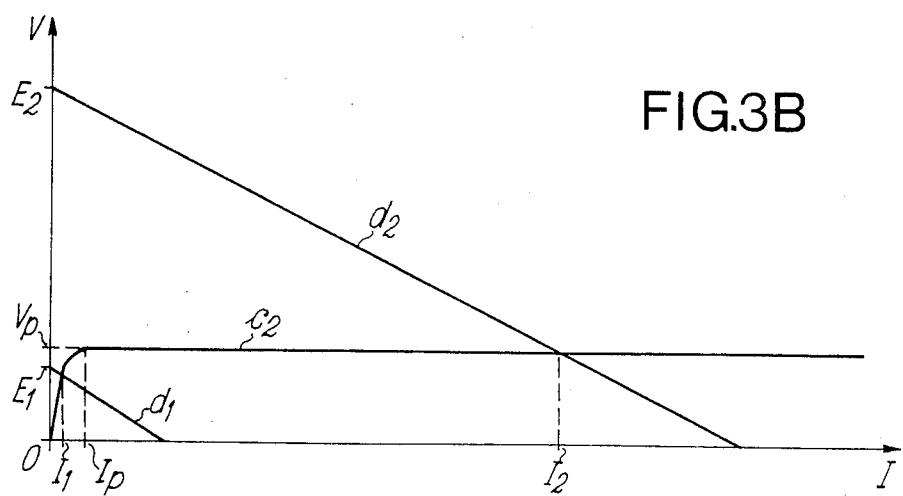
Figure 4B:
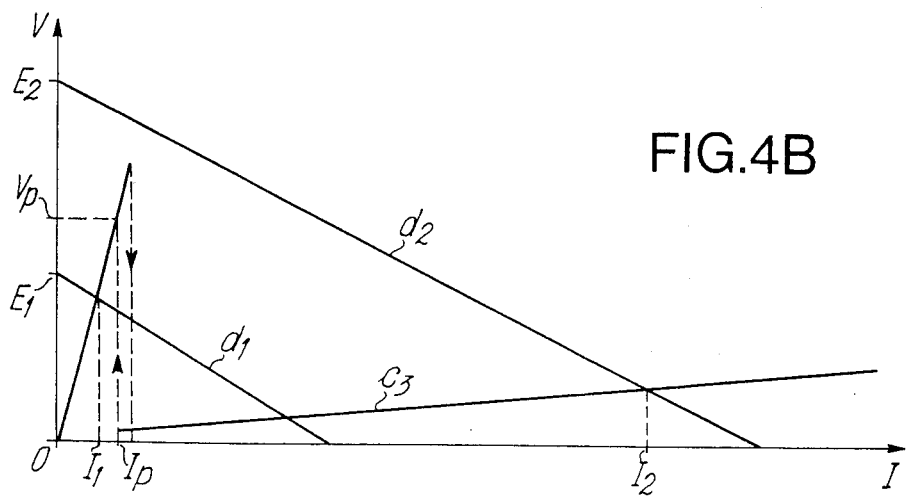

Associated with FIGS. 2A, 3A and 4A are FIGS. 2B, 3B and 4B where the voltage (V) characteristics $c_1$, $c_2$ and $c_3$ as a function of the current (I) are given for the first, second and third types of second and third dipoles 7 and 8 respectively. These three dipole types have a relatively high predetermined resistance in a first low-current region and a relatively low-resistance in a second high-current region where the amplitudes of the usual working currents in the telephone lines are included, except in the rest phase. As a result of this, the telephone line connection conditions, particularly those dependent on power supply and attenuation, are merely slightly modified by the presence of a second or third dipole. On the other hand, the results of loop resistance measurements in the line, or insulation of a line lead with respect to ground, are considerably modifed in terms of the measurement voltage that is fed into terminals $A_1$ and $A_2$ at the telephone exchange end by the measuring and testing apparatus.

In FIGS. 2B, 3B and 4B, the two afore-mentioned current regions lie approximately on either side of a current value $I_p$ which corresponds to a voltage $V_p$ and which determines the change in slope or the change in state in the three dipole types from a high resistance to a low resistance impedance. The characteristic point ($I_p$, $V_p$) in each of FIGS. 2B, 3B and 4B respectively indicates a maximum ohmic value flip-over threshold of thermistor 70, a cross over to a linear bias region of diodes 71 and 72, and the activation of relay 73 which controls the closing of contact 75 to shunt resistor 74. The values $I_p$ and $V_p$ are generally different in FIGS. 2B, 3B and 4B and depend on the characteristics of the components which are included in each of first, second and third types of dipole respectively.

In FIGS. 2B, 3B and 4B are two straight lines $d_1$ and $d_2$ respectively representing the characteristic $V(I) = E - rI$ seen from across terminals 2 and 4 of dipole 7, and from terminals 3 and 5 of dipole 8. The V(I) characteristics are derived in response to voltage E imposed by the measuring apparatus on line L for an insulation fault in the second line section S.

In FIGS. 2B, 3B and 4C, it is assumed that (1) an insulation fault is located between the line lead $L_1$ and $L_2$ and ground, (2) E is the voltage applied by the measuring apparatus betwee the terminal $A_1$ or $A_2$ and ground, and (3) r is the sum of the resistances of the measuring apparatus and the lead $L_1$ or $L_2$ as increased by the resistance of an insulation fault with respect of ground.

When an insulation fault is located in the second line section $S_2$ between the line leads $L_1$ and $L_2$, E is half the voltage applied by the measuring apparatus between the terminals $A_1$ and $A_2$, and r is half the sum of the resistance of the measuring apparatus, the line resistance—which is practically of the resistance of one of its leads—and half the insulating fault resistance because of the presence of two identical dipoles 7 and 8 in the loop.

The first straight line $d_1$ results from a measuring voltage $E_1$ applied to terminals $A_1$ and $A_2$ such that the dipole operated in the first low-current region, as a result of the $E_1$ and r values. Each of lines $d_1$ intersects curves c at a point which corresponds to a current $I_1$ such that $0 < I_1 \leq I_p$.

The second straight line $d_2$ results from a measuring voltage $E_2$ which causes the dipole to operate in the second high current region, as a result of the $E_2$ and r values.

Each of the lines $d_2$ intersects each of curves c at a point which corresponds to a current $I_2$ such that $I_p << I_2$.

Under these conditions, the distinction between a short circuit that is located in the first line section $S_1$, and a short circuit that is located in the second line section $S_2$ or in the load, is determined by measuring the ohmic values of the quotient E/I for measurement voltages $E_1$ and $E_2$. After having observed, by applying voltage $E_2$, that the measured resistance corresponds to the presence of a short circuit or an analogous fault, the measurement voltage $E_1$ is fed to the terminals $A_1$ and $A_2$. If there is virtually no change in the previously measured resistance, the presence of dipoles 7 and/or 8 has no effect on the measurement. Consequently, the short circuit or similar fault is located in the first line section S, i.e., at the measuring apparatus end, between the terminals $A_1$, $A_2$ and the terminals 2, 3. Should, however, there be an increase in the resistance measured in response to application of the voltage $E_1$ with respect to that measured previously at the voltage $E_2$, this means that the current is flowing through one or the other or both dipoles 7, 8. The fault is, therefore, located in the second line section $S_2$ or in the load.

In the invention, for a telephone line, the disturbance produced by one or both dipoles 7, 8 is negligible when the components in such a dipole are selected such that the current $I_p$ does not fall within the normal operating current region -excluding rest- or a subscriber telephone installation. The current $I_p$ is preferably less than or approximately equal to 5 mA. Furthermore, the increase in resistance when measuring at the voltage $E_1$ must be sufficiently high to be observed with no ambiguity, which leads to choosing a $V_p$ $I_p$ ratio, i.e. a dipole resistance in the low-current region ($I < I_p$) of around 1 kOhm for instance.

The voltage $V_p$ is chosen to be a few volts when one or both dipoles 7, 8 are of the first type including a thermistor 70 (FIG. 2A), or second type comprising a relay 73 (FIG. 4A). The voltage $V_p$ is defined by the nature of the junction of diodes 71, 72, when one or both dipoles are of the second type (FIG. 3A). For this second dipole type however, an integer multiple of the voltage $V_p$ is obtained by connecting several elementary second type dipoles in series so the multiple of the voltage $V_p$ corresponds to the forward drop of a simple pair of oppositely poled diodes.

The choice between the various dipole 7, 8 types and the optimization of the $V_p$ and $I_p$ values are determined by the norms enacted for the construction and maintenance of the subscriber terminal equipment and by the surrounding characteristics of the subscriber lines in question. Furthermore, various voltage couples $E_1$, $E_2$ can be chosen depending on whether an insulation measurement between a line lead $L_1$ and $L_2$ and ground or between the two line leads $L_1$ and $L_2$ is involved. This takes account of the fact that a single dipole 7 or 8 comes into play in the event of an insulation measurement with respect of ground whereas both dipoles 7 and 8 come into play in the event of a measurement between the two line leads, and the fact that the measurement regions for these two test types are possibly different.

Further embodiments of the test device may be envisioned by those skilled in the art on the basis of the foregoing specification without departing from the spirit and scope of this invention as defined by the claims appended hereto and without modifying the operational and measurement principles set forth above.

Although second and third dipoles 7, 8 as illustrated in FIG. 1 are at the load end, in the second line section $S_2$, it is also possible to connect one or both dipoles in the first line section, at the test and measuring apparatus end between the terminals $A_1$, $A_2$ and first dipole 6. The first embodiment is, however, preferred since the presence of one or both dipoles 7, 8 at the measuring apparatus end comes into play in capacitance measuring for locating a line cut-off.

The test device can only comprise first dipole 6, or one of second and third dipoles 7 and 8, or the two dipoles 7 and 8, or first dipole 6 and one of dipoles 7 and 8. When the device includes only one of second and third dipoles 7, 8, the disturbance caused by connecting the dipole in the line is advantageously divided by two as compared to the overall embodiment shown in FIG. 1. However, insulation fault location with respect to ground is abandoned for the line lead that does not comprise a dipole, 7 or 8, whereas insulation fault location between the other line lead and ground or between the two line leads is retained.

For specific applications to a load such as a telephone installation having one or several ringing bells, the terminal 62 that is common to resistor 60 and capacitor 61 as shown in FIG. 1, can be directly connected to one of the terminals for the bell or bells. Capacitor 61 further acts as a means for direct decoupling a bell or several bells of the telephone subscriber installation.

LINES WITH SEVERAL TEST DEVICES

On the other hand, several, perhaps identical test devices embodying the invention can be connected at various points along a two-lead line to distinguish fault locations in the line sections thus defined.

For such a situation, assume that two identical entire test devices are connected in the line. Each of these two test devices causes an apparent capacitance increase equal to 1 µF and an apparent resistance variation equal to 1 kohm at two points in the telephone line; the first point is for example a connection point representative of the telephone frame in an exchange serving the line and the second point is an interface between a telephone line and an interior telephone installation of the subscriber.

When a cut-off, i.e. open circuit, occurs in the line, if the measured capacitance is less 1 µF, the cut-off is then located between the test and measuring apparatus and the telephone frame and the two test devices are not energized; if the measured capacitance lies between 1 and 2 µF, the cut-off is in the line between the telephone frame and the subscriber installation, i.e. between the two test devices and the first of the two test devices at the telephone frame is only energized; and if the measured capacitance is greater than 2 µF, the cut-off is in the subscriber interior installation since both test devices are energized.

Similarly, when locating a loop or short circuit in the line, if the resistance variation between a resistance measurement under a low current and a resistance measurement under a noticeable current resistance is zero, the fault is located between the test and measuring apparatus and the telephone frame; if the resistance variation amounts to 1 kOhm, the fault is in the line itself, i.e. between the two test devices; and if the resistance variation is 2 kOhms, the fault is in the subscriber interior installation.

In the case where only a test device is connected in the line, the resistance measurements can be replaced by current measurements at known voltages or voltage measurements at known currents.

What I claim is:

1. A test device for locating faults in a two-lead line, said test device comprising a dipole circuit including a resistor connected in series with a capacitor, terminals of the dipole circuit being connected between the two leads of said line so current on one of the leads flows through the dipole circuit to the other lead while the line is in normal operation and being tested.

2. A test device as claimed in claim 1 wherein the capacitance of said capacitor is substantially equal to 2 µF and the resistance of said resistor is substantially equal to 20 kOhms.

3. A test device as claimed in claim 1 wherein the terminal common to said resistor and said capacitor is connected to one of the terminals of a ringing means of a telephone subscriber installation forming a load of said line.

4. In a test system for locating faults in a two-lead line, several dipole test device circuits, each dipole circuit having first and second terminals respectively connected to first and second leads of said line so current on one of the leads flows through each of the dipole circuits to the other lead while the line is in normal operation and being tested, each of said dipole circuits comprising a resistor connected in series with a capacitor.

5. A test device for locating faults in a two-lead line, said test device being a dipole connected in series with one of the leads of said line and having a predetermined resistance in a low-current region while the line is tested and a resistance lower than said predetermined resistance in a higher-current region adjacent said low-current region while the line is operating normally regardless of the direction of current flow in the line, wherein an intermediate current between said two current regions is substantially less than 5 mA.

6. A test device as claimed in claim 5 wherein the value of said predetermined resistance is substantially equal to one kohm.

7. A test device for locating faults in a two-lead line, said test device comprising a relay having an operate coil responsive to current in the line and a make contact, and a resistor connected in series with said relay coil on one of the leads of said line and connected in parallel with said contact so that the resistor is in series with the line while current in the line is below a predetermined value and the resistor is short circuited while current in the line is above the predetermined value.

8. A test device as claimed in claim 7 comprising a capacitor connected in parallel with the series circuit formed by said relay coil and said resistor.

9. A test device as claimed in claim 7 or 8 comprising a capacitor connected in parallel with said relay coil.

10. A test device for locating faults in a two-lead line, said device comprising first and second dipoles respectively connected in series with first and second leads of said line, each of said dipoles having a predetermined resistance in a low-current region and a resistance lower than said predetermined resistance in a higher-current region adjacent said low-current region regardless of the direction of current flow in the line.

11. A test device as claimed in claim 10 wherein each of said dipoles comprises a negative temperature-coefficient thermistor.

12. A test device as claimed in claim 10 wherein each of said dipoles comprises a pair of oppositely poled diodes.

13. A test device as claimed in claim 10 wherein each of said dipoles comprises a relay having an operate coil and a make contact, and a resistor connected in series with said relay coil on said respective line lead and connected in parallel with said contact.

14. In a test system for detecting the position of faults along a two-lead line, 1, 2 ... k ... n test dipoles series connected with one of the leads of said line, each of said test dipoles being located at a different region along the line where the fault position is to be detected so test dipole k is provided for a region along the line between test dipoles (k−1) and (k+1), each of said test dipoles having a predetermined resistance in a low-current region and a resistance lower than said predetermined resistance in a higher-current region wherein normal line current flows, the higher current region being adjacent said low-current region, the resistance in the higher current region having about the same value regardless of the direction of current flow in the line.

15. In a test system for locating faults in a two-lead line, several test devices connected in series with the line at various points along said line, each of said test devices comprising first and second dipoles respectively connected in series with first and second leads of said line, each of said dipoles having a predetermined resistance in a low-current region and a resistance lower than said predetermined resistance in a higher-current region adjacent said low-current region regardless of the direction of current flow in the line.

16. A test device for locating faults in a two-lead line, said device comprising:
  a first dipole having first and second terminals respectively connected to two leads of said line so current on one of the leads flows through the first dipole to the other lead while the line is in normal operation, the first dipole comprising a resistor connected in series with a capacitor, and
  a second dipole connected in series with one of said line leads and having a predetermined relatively high resistance while a range of relatively low-currents flows through it and a relatively low resistance while a range of relatively high currents flows through it, the high and low current regions being adjacent each other.

17. A test device as claimed in claim 16 further comprising a third dipole connected in series with another lead of said line and being analogous to said second dipole.

18. A test device as claimed in claim 17 wherein each of said second and third dipoles comprises a negative temperature-coefficient thermistor.

19. A test device as claimed in claim 17 wherein each of said second and third dipoles comprises a pair of oppositely poled diodes.

20. A test device as claimed in claim 17 wherein each of said second and third dipoles comprises a diode, said diodes of said second and third dipoles being conductive in the same direction as current flowing in said line.

21. A test device as claimed in claim 17 wherein each of said second and third dipoles comprises a relay having an operate coil and a make contact, and a resistor connected in series with said relay coil on the respective line lead and connected in parallel with said contact.

22. A test device as claimed in claim 21 wherein each of said second and third dipoles comprises a capacitor connected in parallel with the series-combination formed by said resistor and said relay coil of said dipole.

23. A test device as claimed in claim 21 wherein each of said second and third dipoles comprises a capacitor connected in parallel with said relay coil of said dipole.

24. In a test system for locating faults in a two-lead line, several test devices as claimed in any one of claims 16 to 23 connected at various points along said line.

25. A method of determining the location of an abnormally high impedance along either wire of a two-wire line normally having a relatively low impedance along each wire, the wires being shunted by a capacitive charging dipole network having a capacitor with a capacitance much greater than the distributed capacitance between the wires, the distributed capacitance and capacitance of the dipole network being reflected back to terminals of the line remote from the load and the dipole network as a relatively low capacitive value when the wires have the relatively high impedance between the terminals and the dipole network, the distributed capacitance and capacitance of the dipole network being reflected back to terminals of the line remote from the load and the dipole network as a relatively high capacitive value when the wires have the relatively high impedance between the load and the dipole network, comprising sensing the capacitance at the terminals, and determining whether the sensed capacitance is in a range approximately equal to the relatively low capacitive value or is in a range approximately equal to the relatively high capacitive value to locate the position of the abnormally high line impedance relative to the terminals and the dipole network.

26. A method of determining the location of an abnormally high impedance along either wire of a two-wire line normally having a relatively low impedance along each wire, the wires being shunted by plural capacitive charging dipole networks 1, 2 ... k ... N, each having a capacitor with a capacitance much greater than the distributed capacitance between the wires, the distributed capacitance and capacitance of the dipole networks being reflected back to terminals of the line remote from the load and the dipole networks as a capacitive value $C_k$ in a range from $C_{K-1}$ to $C_K$ when the wires have the relatively high impedance between dipole network (k−1) and dipole network k, the distributed capacitance and capacitance of the dipole networks being reflected back to terminals of the line remote from the load and the dipole networks as a capacitive value $C_{k+1}$ in a range from $C_K$ to $C_{K+1}$ when the wires have the relatively high impedance between the dipole network k and dipole network k+1, where $C_K$ is a capacitive value less than $C_{K+1}$ and greater than $C_{K-1}$, comprising sensing the capacitance at the terminals, and determining whether the sensed capacitance is in the range between $C_{K-1}$ and $C_K$ or between $C_K$ and $C_{K+1}$, indicating that the high impedance subsists between dipole network (k−1) and k in response to the sensed capacitance being between $C_{K-1}$ and $C_K$, and indicating that the high impedance subsists between dipole network k and dipole network (k+1) in response to the sensed capacitance being between $C_K$ and $C_{K+1}$ to locate the position of the abnormally high line impedance.

27. A method of determining the location of an abnormally low impedance between two wires of a loaded line normally having a relatively high impedance between the two wires, at least one of the wires being connected in series with a dipole network having a component with a non-linear impedance such that the component has relatively high and low impedances while low and high currents are respectively flowing through it, the impedances of the dipole network and the line being reflected back to terminals of the line remote from the dipole network and the load so there are two distinct regions of a current-voltage characteristic at the terminals, comprising determining the resistance at the terminals while relatively high and low voltages are applied to the terminals, the response to the resistance at the terminals being approximately the same while the high and low voltages are applied to the terminals indicating that the low impedance is between the terminals and the dipole network, in response to the resistance at the terminals being significantly different while the high and low voltages are applied to the terminals indicating that the low impedance is between the load and the dipole network.

28. A method as claimed in claim 27 wherein the impedance is significantly higher while the low voltage is applied to the terminals.

29. A test device for locating faults in a two-lead line, said test device comprising a relay having an operate coil responsive to current in the line, a contact means and a resistor; the resistor, coil and contact means being connected with each other and the line so that the resistor is in series with the line while current in the line is below a predetermined value and the resistor is short circuited while current in the line is above the predetermined value.

30. A test device for locating faults in a two-lead line, said test device being a dipole connected in series with one of the leads of said line and having a predetermined resistance in a low-current region while the line is tested and a resistance lower than said predetermined resistance in a higher-current region adjacent said low-current region while the line is operating normally regardless of the direction of current flow in the line, wherein the value of said predetermined resistance is substantially equal to one kohm.

31. In combination, a two-lead line, means for locating faults in the two-lead line, said fault locating means including: a dipole connected in series with one of the leads of said line, means for applying a test condition across end terminals of the leads of the line, said dipole having a predetermined resistance in a low-current region while the end terminals of the leads of the line are being subject to the test condition and a resistance lower than said predetermined resistance in a higher-current region adjacent said low current region while the line is operating normally regardless of the direction of current flow in the line, impedance characteristics being reflected from the line back to end terminals of the two leads of the line in response to the locations of faults along the line while the test condition is being applied across the end terminals, and means responsive to the reflected impedance characteristics for enabling an indication of the fault location to be derived.

32. The combination of claim 31 wherein the dipole includes a negative temperature-coefficient thermistor.

33. The combination of claim 31 wherein the dipole includes a pair of oppositely poled diodes connected in series with one of the leads of said line between a pair of series terminals of said one line lead, each of said diodes having a cathode and an anode, the cathode of each diode being connected to the anode of the other of said diodes so that the impedance between the pair of terminals for current flow from a first of the terminals to a second of the terminals is approximately the same as the impedance for current flow from the second terminal to the first terminal.

34. In combination, a two-lead line, means for locating faults in the two-lead line, said fault locating means including: a negative temperature-coefficient thermistor connected in series with one of the leads of said line, and impedance measuring means connected across the end terminals of the two leads of the line.

35. A test device for locating short circuits in a two-lead line, said test device comprising a negative temperature-coefficient thermistor connected in series with one of the leads of said line, said thermistor having a predetermined resistance in a low-current region to enable a short circuit in said line to be located while a test current in said low-current region flows through said thermistor and said short circuit, said thermistor having a resistance lower than said predetermined resistance in a higher-current region adjacent said low-current region while said line is normally operating.

* * * * *